(12) United States Patent
Machinaga et al.

(10) Patent No.: US 9,899,549 B2
(45) Date of Patent: Feb. 20, 2018

(54) INFRARED-RAY SENSING DEVICE (71) Applicant: SUMITOMO ELECTRIC INDUSTRIES, LTD., Osaka (JP)

(72) Inventors: Kenichi Machinaga, Yokohama (JP); Yasuhiro Iguchi, Yokohama (JP); Takahiko Kawahara, Fujisawa (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/585,738

(22) Filed: May 3, 2017

(65) Prior Publication Data

US 2017/0358696 A1 Dec. 14, 2017

(30) Foreign Application Priority Data

Jun. 14, 2016 (JP) .................................. 2016-118154

(51) Int. Cl.
| | |
|---|---|
| *H01L 31/00* | (2006.01) |
| *H01L 31/0352* | (2006.01) |
| *H01L 27/146* | (2006.01) |
| *H01L 31/0304* | (2006.01) |

(52) U.S. Cl.
CPC ........... *H01L 31/035236* (2013.01); *H01L 27/14649* (2013.01); *H01L 27/14694* (2013.01); *H01L 31/03046* (2013.01)

(58) Field of Classification Search
CPC ....... H01L 31/035236; H01L 21/02507; H01L 29/78687; H01L 33/04; H01L 31/035263; H01L 29/157; H01L 29/158; H01L 29/154; H01L 31/035254; H01L 29/15;

(Continued)

(56) References Cited

U.S. PATENT DOCUMENTS

| | | | | |
|---|---|---|---|---|
| 5,654,578 A | * | 8/1997 | Watanabe | B82Y 20/00 257/438 |
| 8,178,863 B2 | * | 5/2012 | Tennant | B82Y 20/00 257/18 |

(Continued)

FOREIGN PATENT DOCUMENTS

| | | |
|---|---|---|
| JP | 2001-144278 | 5/2001 |
| JP | 2002-100796 | 4/2002 |

*Primary Examiner* — Scott B Geyer (74) *Attorney, Agent, or Firm* — Smith, Gambrell & Russell, LLP.

(57) ABSTRACT

An infrared-ray sensing device includes a support and a plurality of photodiodes disposed on the support. Each photodiode of the plurality includes a first mesa including a first semiconductor layer of a first conductivity type, a second semiconductor layer of the first conductivity type, a third semiconductor layer of a second conductivity type that is disposed between the first and second semiconductor layers, and a super-lattice region disposed on the support along a reference plane. The third semiconductor layer and the super-lattice region are provided in common for the photodiodes of the plurality. In the photodiodes, the first mesas and the second semiconductor layers are aligned along a first axis intersecting the reference plane so that each of the second semiconductor layers is provided in a position corresponding to the position of its first mesa. Each second semiconductor layer is disposed between the third semiconductor layer and the super-lattice region.

9 Claims, 9 Drawing Sheets

(58) Field of Classification Search
CPC ........ H01L 39/128; H01L 31/0352–31/03529; H01L 27/14649
See application file for complete search history.

(56) References Cited

U.S. PATENT DOCUMENTS

| | | | |
|---|---|---|---|
| 8,293,566 B1* | 10/2012 | Kim .................. | H01L 27/14649 257/18 |
| 9,105,804 B2* | 8/2015 | Iguchi .................. | H01L 31/184 |
| 9,391,229 B2* | 7/2016 | Miura ............... | H01L 27/14634 |
| 9,735,311 B2* | 8/2017 | Tsuji .................... | H01L 31/184 |
| 2009/0045389 A1* | 2/2009 | Eun ........................ | H01L 45/06 257/4 |
| 2009/0173976 A1* | 7/2009 | Augusto ........... | H01L 27/14669 257/292 |
| 2010/0301309 A1* | 12/2010 | Tennant ................. | B82Y 20/00 257/21 |
| 2012/0138898 A1* | 6/2012 | Hata .................. | H01L 27/1446 257/21 |
| 2014/0175585 A1* | 6/2014 | Iguchi .................. | H01L 31/184 257/431 |
| 2015/0097157 A1* | 4/2015 | Onakado ........... | H01L 27/14649 257/21 |
| 2016/0172411 A1* | 6/2016 | Tsuji ................. | H01L 27/14643 257/21 |
| 2016/0172530 A1* | 6/2016 | Tsuji .................... | H01L 31/184 438/94 |
| 2016/0197214 A1* | 7/2016 | Balasekaran ....... | H01L 27/1464 257/21 |
| 2017/0040476 A1* | 2/2017 | Miura ............... | H01L 27/14649 |

\* cited by examiner

INFRARED-RAY SENSING DEVICE

BACKGROUND OF THE INVENTION

1. Field of the Invention

The present invention relates to an infrared-ray sensing device.

2. Description of the Related Art

Patent Literature 1 (Japanese Unexamined Patent Application Publication No. 2002-100796) discloses a diffusion-type (planar-type) image sensor. Patent Literature 2 (Japanese Unexamined Patent Application Publication No. 2001-144278) discloses a mesa-type image sensor.

SUMMARY OF THE INVENTION

An image sensor has a diffusion-type (planar-type) structure or a mesa-type structure. A method for producing the diffusion-type (planar-type) image sensor includes a process of performing vapor-phase diffusion of zinc (Zn), which serves as a p-type impurity, into a semiconductor layer. This vapor-phase diffusion process imposes a large burden on the method for producing a planar-type image sensor. On the other hand, the mesa-type image sensor has a mesa structure including a light-receiving layer. The light-receiving layer in the mesa structure has the side surface covered with a passivation film. In such a mesa-type image sensor, recombination centers are generated at the interface between the side surface of the light-receiving layer and the passivation film. The recombination centers cause dark current, which degrades the light receiving sensitivity of the image sensor. Therefore, it is needed to suppress generation of the recombination centers to improve the light receiving sensitivity. In addition, in the mesa-type image sensor, the light-receiving layer is divided into sections each for each pixel associated with the mesa structure, and the light-receiving layer is disposed in the mesa structure. Each section has an area without the light-receiving layer for converting light into photocurrent. The mesa-type image sensor has a light receiving surface on its back surface. Part of incident light through the light receiving surface fails to enter the mesa structure in the mesa-type image sensor so that the part of incident light is not converted into photocurrent. Therefore, it is also needed to reduce the area without the light-receiving layer to improve the light receiving sensitivity for the mesa-type image sensor.

An infrared-ray sensing device according to one aspect of the present invention includes a support having a principal surface; and a plurality of photodiodes disposed on the principal surface of the support. Each of the plurality of photodiodes includes a first mesa including a first semiconductor layer of a first conductivity type, a second semiconductor layer of the first conductivity type, a third semiconductor layer of a second conductivity type that is disposed between the first semiconductor layer and the second semiconductor layer, and a super-lattice region disposed on the principal surface of the support along a reference plane. Each of the third semiconductor layer and the super-lattice region is provided in common for the plurality of photodiodes. The first mesas and the second semiconductor layers are aligned along a first axis intersecting the reference plane so that each of the second semiconductor layers is provided in a position corresponding to the position of first mesa. In addition, the second semiconductor layer is disposed between the third semiconductor layer and the super-lattice region.

The above-described object and other objects, features, and advantages of the present invention will become more readily apparent from the following detailed description of preferred embodiments of the present invention with reference to the accompanying drawings.

DESCRIPTION OF THE PREFERRED EMBODIMENTS

Some specific examples will be described below.

An infrared-ray sensing device according to an embodiment includes a support having a principal surface; and a plurality of photodiodes disposed on the principal surface of the support. Each of the plurality of photodiodes includes a first mesa including a first semiconductor layer of a first conductivity type, a second semiconductor layer of the first conductivity type, a third semiconductor layer of a second conductivity type that is disposed between the first semiconductor layer and the second semiconductor layer, and a super-lattice region disposed on the principal surface of the support along a reference plane. Each of the third semiconductor layer and the super-lattice region is provided in common for the plurality of photodiodes. The first mesas and the second semiconductor layers are aligned along a first axis intersecting the reference plane so that each of the second semiconductor layers is provided in a position corresponding to the position of first mesa. In addition, the second semiconductor layer is disposed between the third semiconductor layer and the super-lattice region.

According to the infrared-ray sensing device, the first mesa and the second semiconductor layer are aligned along the first axis intersecting the reference plane. The second semiconductor layer is aligned with the first mesa in each photodiode. The third semiconductor layer is disposed between the first semiconductor layer in the first mesa and the second semiconductor layer. The second semiconductor layer is disposed between the third semiconductor layer and the super-lattice region. Each of the third semiconductor layer and the super-lattice region is provided in common for the plurality of photodiodes. By forming this stacking structure including the third semiconductor layer, the second semiconductor layer, and the super-lattice region on the support, depletion layers are extended each in the third semiconductor layer and the super-lattice region. The light that has entered the infrared-ray sensing device generates the photocarriers of electron-hole pairs in the third semiconductor layer and/or the super-lattice region in which the depletion layers are extended. The generated carriers are transported through the third semiconductor layer and/or the super-lattice region and flow into at least one of the first mesas formed in the photodiodes. In the infrared-ray sensing device in which the third semiconductor layer and the super-lattice region are provided in common for the photodiodes and each photodiode includes the first mesa, the common third semiconductor layer and the common super-lattice region are used for generating the photocarriers and transporting the photocarriers without forming a deep mesa. In the conventional infrared-ray sensing device, the photocarriers generated in the mesas are used for the detection of the light signal. In the infrared-ray sensing device according to the embodiment, the photocarriers generated between the first mesas are also used for the detection of the light signal so as to improve the light receiving sensitivity.

In the infrared-ray sensing device according to an embodiment, preferably, the first semiconductor layer in the first mesa is in contact with the third semiconductor layer so as to form a first p-n junction at an interface between the first semiconductor layer and the third semiconductor layer. The second semiconductor layer is in contact with the third semiconductor layer so as to form a second p-n junction at an interface between the second semiconductor layer and the third semiconductor layer.

In the infrared-ray sensing device according to an embodiment, preferably, the first semiconductor layer in the first mesa reaches a side surface of the first mesa. The side surface of the first mesa is covered with an insulating film. In addition, the first mesa has a bottom in the third semiconductor layer.

According to the infrared-ray sensing device, the first mesa may define the extension of the depletion layers that are each formed in the third semiconductor layer and the super-lattice region.

In the infrared-ray sensing device according to an embodiment, preferably, each of the plurality of photodiodes further includes a second mesa including the second semiconductor layer. The third semiconductor layer is disposed on a surface of the super-lattice region, a side surface of the second mesa and an upper surface of the second mesa so as to embed the second mesa with the third semiconductor layer.

According to the infrared-ray sensing device, by embedding the second mesa with the third semiconductor layer, the third semiconductor layer may be provided in common for the photodiodes between the second semiconductor layers and the first mesas.

In the infrared-ray sensing device according to an embodiment, preferably, the first mesa has a height larger than a thickness of the first semiconductor layer. The second mesa has a height equal to or larger than a thickness of the second semiconductor layer. The first semiconductor layer in the first mesa is in contact with the third semiconductor layer so as to form a first p-n junction at side and bottom surfaces of the first semiconductor layer. The second semiconductor layer in the second mesa is in contact with the third semiconductor layer so as to form a second p-n junction at side and upper surfaces of the second semiconductor layer.

According to the infrared-ray sensing device, the first mesa has a height larger than the thickness of the first semiconductor layer. In addition, the second mesa has a height equal to or larger than a thickness of the second semiconductor layer. A depletion layer is formed in the vicinity of the p-n junction. Therefore, the depletion layers extend according to the widths of the first mesa and the second mesa. The traverse extension of the depletion layer is defined by the transverse dimensions of the first mesa and the second mesa.

In the infrared-ray sensing device according to an embodiment, preferably, the second semiconductor layer contains InGaAs with p-type conductivity. The InGaAs has a p-type impurity concentration in a range of $5 \times 10^{15}$ cm$^{-3}$ or more and $5 \times 10^{16}$ cm$^{-3}$ or less.

According to the infrared-ray sensing device, the depletion layers may extend into their respective adjacent semiconductor layers.

In the infrared-ray sensing device according to an embodiment, preferably, the super-lattice region including a semiconductor containing antimony as a constituent element. The second semiconductor layer contains an InGaAs/GaAsSb super-lattice with p-type conductivity. The InGaAs/GaAsSb super-lattice of the second semiconductor layer has a p-type impurity concentration in a range of $5 \times 10^{15}$ cm$^{-3}$ or more and $5 \times 10^{16}$ cm$^{-3}$ or less.

According to the infrared-ray sensing device, the depletion layers may extend into their respective adjacent semiconductor layers.

In the infrared-ray sensing device according to an embodiment, preferably, the third semiconductor layer contains n-type InGaAs. The third semiconductor layer is in contact with the second semiconductor layer having p-type conductivity so as to form p-n junctions at an interface between the third semiconductor layer and the second semiconductor layer.

According to the infrared-ray sensing device, p-n junctions are defined by the contact of the third semiconductor layer with the second semiconductor layer.

In the infrared-ray sensing device according to an embodiment, preferably, the super-lattice region includes a multi quantum well structure including an InGaAs/GaAsSb super-lattice.

The findings of the present invention can be easily understood by considering the following detailed description with reference to the accompanying drawings illustrated as examples. Embodiments according to the infrared-ray sensing device of the present invention and a method for producing the infrared-ray sensing device will be described below with reference to the accompanying drawings. Where possible, the same parts are denoted by the same reference characters.

Figure 1:
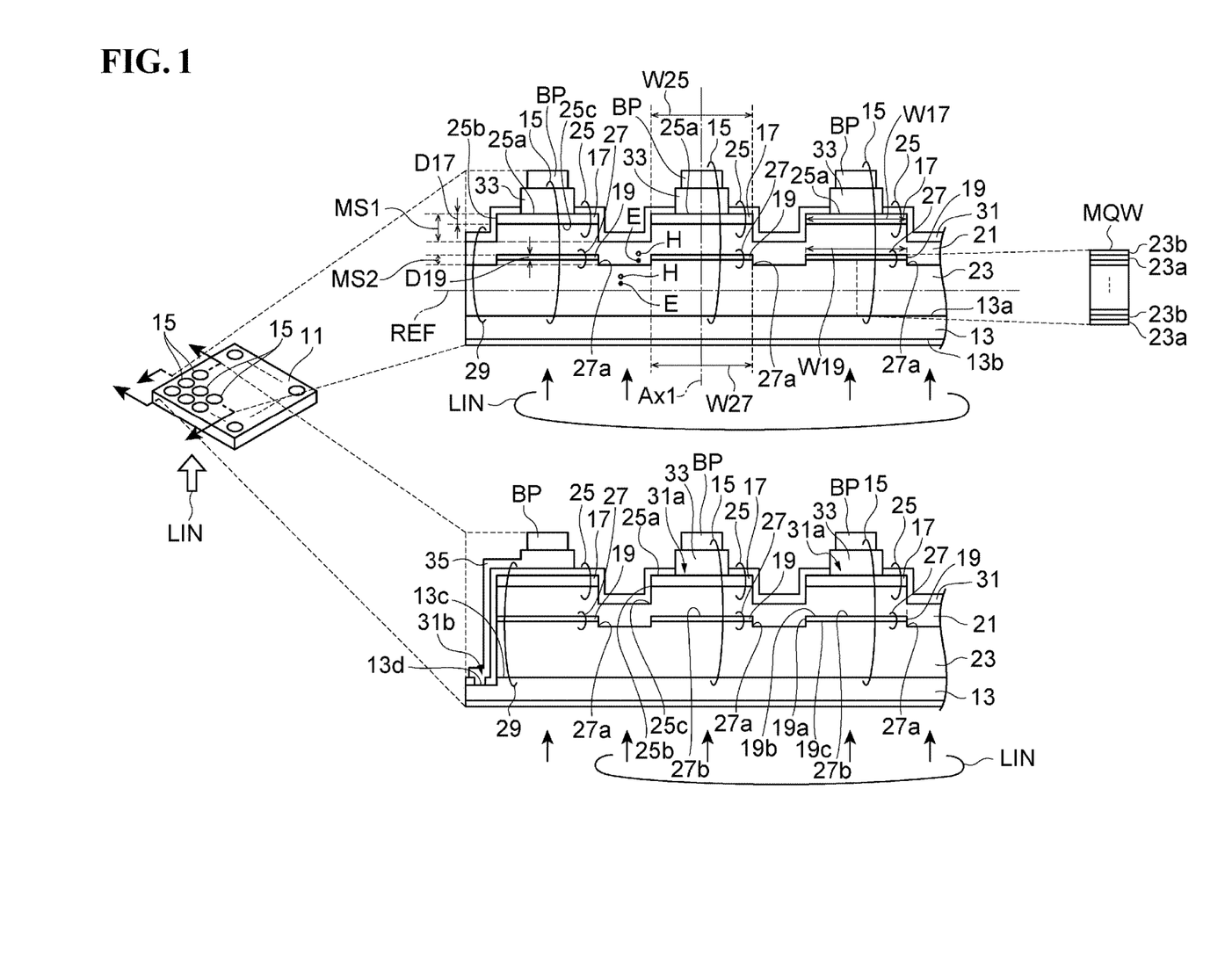
FIG. 1 is a schematic diagram illustrating an infrared-ray sensing device according to an embodiment.

FIG. 1 is a schematic diagram illustrating an infrared-ray sensing device according to an embodiment. An infrared-ray sensing device 11 includes a support 13 and a photodiodes 15. The support 13 has a principal surface 13a and a back surface 13b opposite to the principal surface 13a. In the embodiment, the support 13 includes a semiconductor substrate such as an InP substrate. The support 13 has an array of the photodiodes 15 on the principal surface 13a. The photodiodes 15 each include a first semiconductor layer 17 of a first conductivity type (either p-type or n-type), a second semiconductor layer 19 of a first conductivity type (either p-type or n-type), a third semiconductor layer 21 of a second conductivity type (the other n-type or p-type), and a super-lattice region 23 including a semiconductor containing antimony as a constituent element. The first conductivity type is different from the second conductivity type. For example, when the first conductivity type is a p-type (n-type), the second conductivity type is an n-type (p-type). The first semiconductor layer 17 is included in a first mesa 25 provided for each photodiode 15. The photodiodes 15 each include the first mesa 25. An array of the first mesas 25 is formed on the support 13. The first mesas 25 each include an upper surface 25a and a side surface 25b. The second semiconductor layer 19 has a side surface 19a, an upper surface 19b, and a bottom surface 19c. The second semiconductor layer 19 is disposed between the third semiconductor layer 21 and the super-lattice region 23. In this Example, the second semiconductor layer 19 has the side surface 19a and the upper surface 19b. The second semiconductor layer 19 is connected to the third semiconductor layer 21 through the side surface 19a and the upper surface 19b and is connected to the super-lattice region 23 through the bottom surface 19c. The third semiconductor layer 21 is disposed between the first semiconductor layers 17 and the second semiconductor layers 19 so as to be provided in common for the array of the photodiodes 15. The super-lattice region 23 is provided in common for the array of the photodiodes 15 and extends along a reference plane REF that is substantially parallel to the principal surface 13a of the support 13. In this Example, the photodiodes 15 are arranged so as to form a two-dimensional array. The photodiodes 15 may be arranged so as to form a one-dimensional array. The second semiconductor layer 19 and the first mesa 25 are aligned along a first axis Ax1 that intersects the reference plane REF. The height MS1 of the first mesa 25 is larger than the thickness D17 of the first semiconductor layer 17. The super-lattice region 23 has, for example, a type-II multi quantum well (MQW) structure. The quantum well structure MQW includes a well layer 23a and a barrier layer 23b that are stacked alternately.

The first semiconductor layer 17 is made of, for example, p-type InGaAs. The second semiconductor layer 19 is made of, for example, p-type InGaAs or p-type InGaAs/GaAsSb. The third semiconductor layer 21 is made of, for example, n-type InGaAs. The second semiconductor layer 19 has a carrier concentration lower than that of the first semiconductor layer 17. The first semiconductor layer 17 has a carrier concentration higher than that of the third semiconductor layer 21. The third semiconductor layer 21 has a carrier concentration lower than that of the second semiconductor layer 19. This causes a depletion layer to be formed in the third semiconductor layer 21. The second semiconductor layer 19 has a carrier concentration higher than that of the super-lattice region 23. This causes a depletion layer to be formed in the super-lattice region 23. The third semiconductor layer 21 is in contact with the first semiconductor layer 17. A first p-n junction is defined by contact of the bottom surface (if present, side surface) of the first semiconductor layer 17 with the third semiconductor layer 21. The first p-n junction is formed at an interface between the first semiconductor layer 17 and the third semiconductor layer 21. In this Example, the first p-n junction reaches the side surface of the first mesa 25. The third semiconductor layer 21 is in contact with the second semiconductor layer 19 and the super-lattice region 23. A second p-n junction is defined by contact of the upper surface and the side surface of the second semiconductor layer 19 with the third semiconductor layer 21. The second p-n junction is formed at an interface between the second semiconductor layer 19 and the third semiconductor layer 21.

According to the infrared-ray sensing device 11, the second semiconductor layer 19 and the first mesa 25 are aligned along the first axis Ax1 that intersects the reference plane REF. The second semiconductor layer 19 is provided in a position corresponding to the position of first mesa 25 for each of the photodiodes 15. The third semiconductor layer 21 is disposed between the first semiconductor layer 17 in the first mesa 25 and the second semiconductor layer 19. The second semiconductor layer 19 is disposed between the third semiconductor layer 21 and the super-lattice region 23. The third semiconductor layer 21 and the super-lattice region 23 are provided in common for the array of the photodiodes 15. In the stacked structure including the third semiconductor layer 21, the second semiconductor layer 19, and the super-lattice region 23, the impurity concentration of the second semiconductor layer 19 is set such that depletion layers are each formed in the third semiconductor layer 21 and the super-lattice region 23. The first mesa 25 having a height larger than the thickness D17 of the first semiconductor layer 17 enables the depletion layers to extend according to the width W25 of the first mesa 25 and the width W19 of the second semiconductor layer 19. The light LIN that has entered the infrared-ray sensing device 11 generates electron-hole pairs (E, H) in the third semiconductor layer 21 and/or the super-lattice region 23. The generated carriers are transported through the third semiconductor layer 21 and/or the super-lattice region 23 and flow into any one of the first mesas 25 formed in the array of the photodiodes 15. According to this structure including the common third semiconductor layer 21, the common super-lattice region 23 and the first mesas 25 each for each photodiode 15, the common semiconductor regions (21, 23) serving for photoelectric conversion and transport of carriers are provided without forming a deeper mesa.

The depletion layer in the first mesa 25 extends from the first semiconductor layer 17 having a width W17 and is limited by the first mesa 25 having a width W25. In the infrared-ray sensing integrated device, as illustrated in FIG. 1, the first semiconductor layer 17 reaches the side surface 25b of the first mesa 25. The side surface 25b of the first mesa 25b is covered with an insulating film 31. The insulating film 31 includes, for example, a silicon-based inorganic insulating film (made of, for example, silicon oxide, silicon nitride, or silicon oxy-nitride). The first mesa 25 has its bottom 25c in the third semiconductor layer 21. According to the infrared-ray sensing device 11, the first mesa 25 may define the extension of the depletion layers that are each formed in the third semiconductor layer 21 and the super-lattice region 23 by the second semiconductor layer 19.

The infrared-ray sensing integrated device includes a third mesa 29 formed on a partially exposed principal surface 13a of the support 13. The principal surface 13a of the support 13 has a first portion 13c and a second portion 13d. The third mesa 29 is formed on the second portion 13d of the principal surface 13a. The third mesa 29 includes an array of the first mesas 25 and an array of the second mesas 27. The first mesa 25 has a width W25, and the second mesa 27 has a width W27. The insulating film 31 includes a first opening 31a on the upper surface 25a of the first mesa 25 and a second opening 31b on the second portion 13d of the principal surface 13a. The infrared-ray sensing integrated device includes a first electrode 33 and a second electrode 35. The first electrode 33 is formed in the first opening 31a and is in contact with the upper surface 25a of the first mesa 25 through the first opening 31a. The second electrode 35 is formed in the second opening 31b and is in contact with the principal surface 13a of the support 13 through the second opening 31b.

In the infrared-ray sensing device 11, the photodiodes 15 each further include the second mesa 27 including the second semiconductor layer 19. The second mesa 27 has a height MS2 equal to or larger than the thickness D19 of the second semiconductor layer 19. The second mesa 27 is embedded in the third semiconductor layer 21 so that the side surface 27a and the upper surface 27b of the second mesa 27 are covered with the third semiconductor layer 21. Embedding the second mesa 27 in the third semiconductor layer 21 allows the third semiconductor layer 21 provided in common for the array of the photodiodes 15 between the second semiconductor layers 19 and the first mesas 25. In this Example, the second mesa 27 includes part of the super-lattice region 23 (specifically, one or more semiconductor layers (at least one of well layers 23a and barrier layers 23b)) in addition to the second semiconductor layer 19.

Example Infrared-Ray Sensing Device 11
Support 13: InP
Conductivity type of surface of support 13: n-type
First semiconductor layer 17: Zn-doped InGaAs
Dopant concentration of first semiconductor layer 17: $1 \times 10^{18}$ to $3 \times 10^{18}$ cm$^{-3}$
Thickness of first semiconductor layer 17: 300 to 1000 nm
Second semiconductor layer 19: Zn-doped InGaAs
Dopant concentration of second semiconductor layer 19: $5 \times 10^{15}$ to $5 \times 10^{16}$ cm$^{-3}$
Thickness of second semiconductor layer 19: 10 to 100 nm The second mesa 27 can include a Zn-doped InGaAs/GaAsSb super-lattice.

Third semiconductor layer 21: Undoped (n-type) InGaAs
Carrier concentration of third semiconductor layer 21: $1 \times 10^{15}$ cm$^{-3}$ or lower in terms of n-type impurity concentration
Thickness of third semiconductor layer 21 (layer thickness on second mesa): 200 to 1000 nm
Thickness of third semiconductor layer 21 (layer thickness between first mesas): 120 to 1000 nm
Super-lattice region 23 (well layer 23a/barrier layer 23b): InGaAs/GaAsSb
First electrode 33: Ti/Pt/Au
Second electrode 35: Ti/Pt/Au In this Example, the bottom layer (for example, the first semiconductor layer 17) of the first mesa 25 preferably has substantially the same composition as the third semiconductor layer 21 so as to form a homojunction at an interface between the bottom layer of the first mesa 25 and the third semiconductor layer 21. The first semiconductor layer 17 and the third semiconductor layer 21 form the first p-n junction by the contact of the first semiconductor layer 17 with the third semiconductor layer 21. In this case, a depletion layer formed in the vicinity of the p-n junction is easily extended as compared with the heterojunction. Similarly, the uppermost layer (for example, the second semiconductor layer 19) of the second mesa 27 preferably has substantially the same composition as the third semiconductor layer 21 so as to form a homojunction at an interface between the uppermost layer of the second mesa 27 and the third semiconductor layer 21. The second semiconductor layer 19 and the third semiconductor layer 21 form the second p-n junction by the contact of the second semiconductor layer 19 with the third semiconductor layer 21. In this case, a depletion layer formed in the vicinity of the p-n junction is easily extended as compared with the heterojunction.

In the second semiconductor layer 19 containing InGaAs with p-type conductivity, this InGaAs includes a p-type dopant with an impurity concentration in a range of $5 \times 10^{15}$ cm$^{-3}$ or more and $5 \times 10^{16}$ cm$^{-3}$ or less. Alternatively, in the second semiconductor layer 19 containing an InGaAs/GaAsSb super-lattice with p-type conductivity, the InGaAs/GaAsSb super-lattice includes a p-type dopant with an impurity concentration in a range of $5 \times 10^{15}$ cm$^{-3}$ or more and $5 \times 10^{16}$ cm$^{-3}$ or less.

Figure 2:
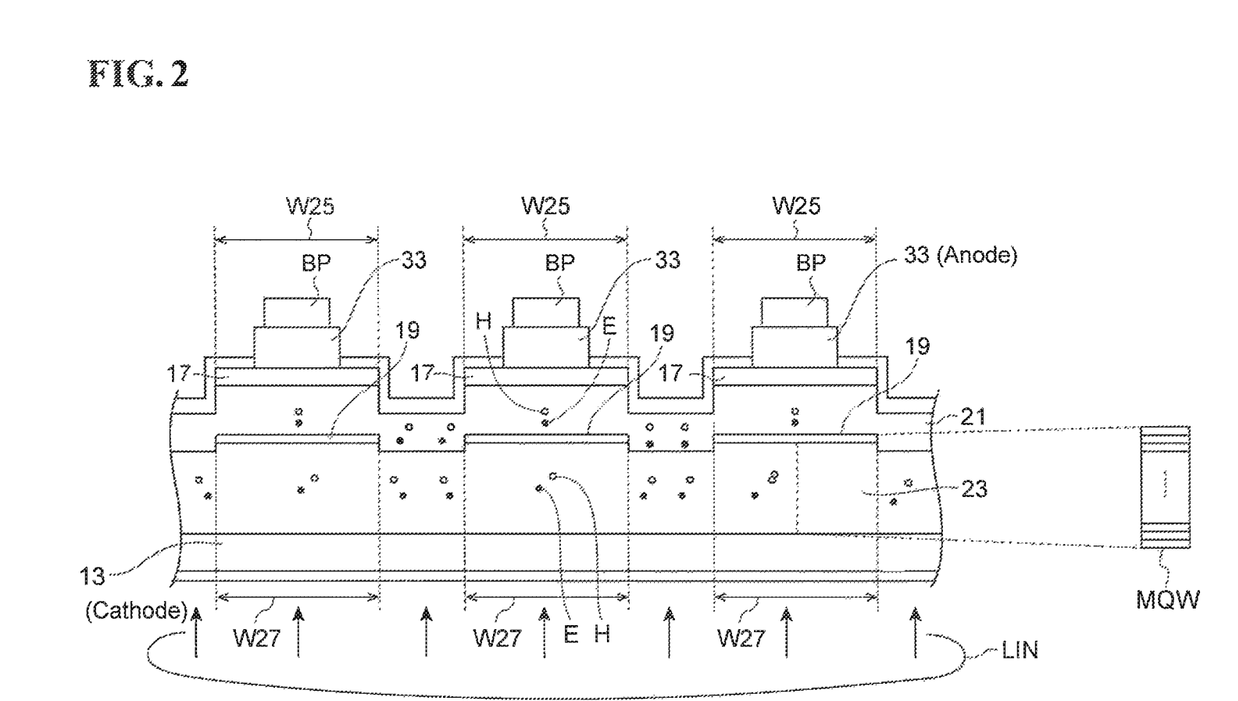
FIG. 2 is a schematic diagram illustrating an array of three photodiodes in the infrared-ray sensing device according to this embodiment.

FIG. 2 is a schematic diagram illustrating an array of three photodiodes in the infrared-ray sensing device according to this embodiment. The light LIN enters the back surface of the infrared-ray sensing device 11. The infrared-ray sensing device 11 is a back-surface irradiation type image sensor. Referring to FIG. 2, electron-hole pairs (electrons E, holes H) generated in these three photodiodes 15 and their surroundings are illustrated for the photodiodes 15. The light LIN generates electron-hole pairs (E, H) in the third semiconductor layer 21 and/or the super-lattice region 23. The photodiode 15 has the first mesa 25 and the second mesa 27. By forming these two mesas, an array of the photodiodes 15 includes the common third semiconductor layer 21 and the common super-lattice region 23. When the light enters the array of the photodiodes 15 through the back surface of the support 13, electrons and holes are generated in the third semiconductor layer 21 and/or the super-lattice region 23 independently of the shapes of the first mesa 25 and the second mesa 27. In addition, a depletion layer extends according to the width W25 of the first mesa 25 and the width W27 of the second mesa 27 (the width W19 of the second semiconductor layer 19).

The bottom of the first mesa 25 is located in the third semiconductor layer 21, and the first mesa 25 is located above the second mesa 27. The alignment of the mesas enables a depletion layer to be formed between the bottom of the first mesa 25 including the first semiconductor layer 17 and the second semiconductor layer 19 in the second mesa 27. Moreover, a depletion layer extends from the second semiconductor layer 19 into the super-lattice region 23 without applying a high voltage to the photodiode 15.

The second semiconductor layer 19 is divided by the second mesas 27 and is not provided as a single common layer in the array of the photodiodes 15. By forming the second semiconductor layer 19 in the second mesa 27, the third semiconductor layer 21 and the super-lattice region 23 are provided in common for the array of the photodiodes 15. Moreover, by forming the second semiconductor layer 19 in the second mesa 27, each photodiode 15 serves as a pixel for the infrared-ray sensing device.

In FIG. 2, the flow of electrons among electrons E and holes H is drawn to a cathode. On the other hand, the flow of holes among electrons E and holes H is drawn to an anode. The light that has entered the common areas between three alignments of the mesas illustrated in FIG. 2 is also converted into electrons E and holes H. The generated electrons E and holes H flow into any one of the photodiodes 15 according to the electric field distribution in the array of the photodiodes 15.

Figure 3:
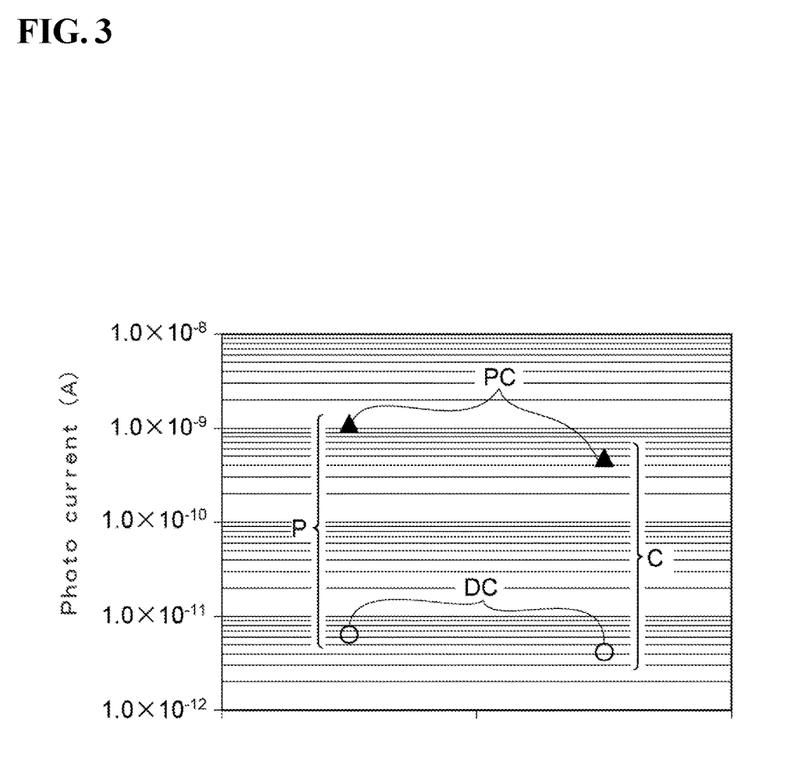
FIG. 3 is a graph illustrating dark current (DC) and photocurrent (PC) in a two-stage mesa-type photodiode P according to this embodiment and a diffusion-type photodiode C including the same epitaxial structure as that of the two-stage mesa-type photodiode P.

FIG. 3 is a graph illustrating the dark current (DC) and the photocurrent (PC) in a two-stage mesa-type photodiode P in Example. For a comparison, the dark current (DC) and the photocurrent (PC) for a diffusion-type photodiode C including the same epitaxial structure as that of the two-stage mesa-type photodiode P are illustrated in FIG. 3. The vertical axis represents current (unit: ampere). The characteristics of the two-stage mesa-type photodiode P are shown on the left side of the figure. The characteristics of the diffusion-type photodiode C are shown on the right side of the figure. At a temperature of −60 degrees Centigrade, the diffusion-type photodiode C exhibits a dark current of $1\times10^{-11}$ ampere or lower. The two-stage mesa-type photodiode P has a small dark current DC similar to that of the diffusion-type photodiode C. The two-stage mesa-type photodiode P exhibits a photocurrent of $1\times10^{-9}$ ampere or higher for light with a wavelength of 1960 nm and has better photocurrent characteristics than the diffusion-type photodiode C. In the structure of Example, the dark current DC depends on the height of the first mesa 25. In the two-stage mesa-type photodiode P, a depletion layer is formed at the p-n junction between the first semiconductor layer 17 and the third semiconductor layer 21 by applying an outer voltage to the photodiode P. This depletion layer reaches the second mesa 27 at a low voltage level. The second mesa 27 includes the second semiconductor layer 19 having the same conductivity (e.g., p-conductivity) as the first semiconductor layer 17. The second semiconductor layer 19 allows a depletion layer to form in the super-lattice region 23 at a low voltage level. In a single photodiode, the traverse extension of the depletion layer is defined by the transverse dimensions of the first mesa 25 and the second mesa 27. Although the third semiconductor layer 21 and the super-lattice region 23 are provided in common for the array of the photodiodes 15, the depletion layer is independently formed in each photodiode. Each depletion layer receives carriers generated in the semiconductor regions between the photodiodes.

A method for producing the infrared-ray sensing device will be described with reference to FIG. 4A to FIG. 7B. Where possible, the reference characters used in the description with reference to FIG. 1 are used in the following disclosure for easy understanding.

Figure 4A:
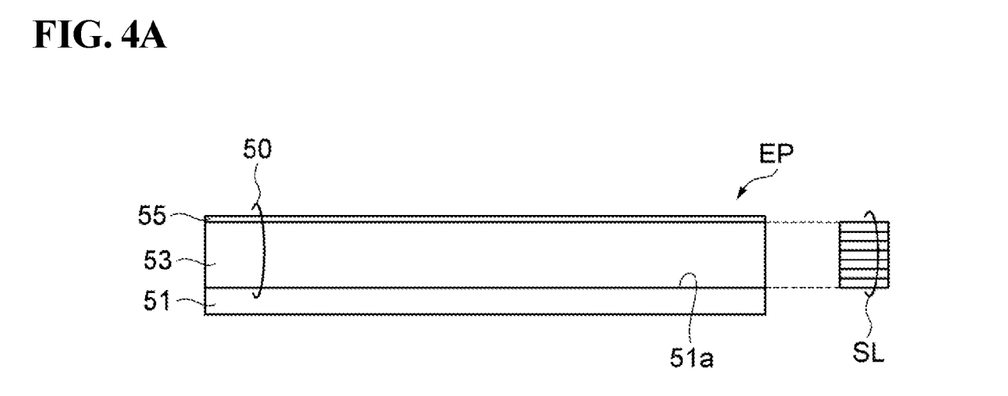
FIGS. 4A and 4B are schematic diagrams illustrating main steps in a method for producing the infrared-ray sensing device according to this embodiment.

As illustrated in FIG. 4A, a substrate 51 for epitaxial growth is prepared. A first epitaxial region 50 is grown on a principal surface 51a of the substrate 51 to form an epitaxial substrate EP. The first epitaxial region 50 includes a super-lattice structure 53 including undoped InGaAs layers and undoped GaAsSb layers that are stacked alternately and a first semiconductor film 55 (p-type InGaAs). The super-lattice structure 53 is grown on the principal surface 51a of the substrate 51 and includes a type II super-lattice SL for a light-absorbing layer. The first semiconductor film 55 is grown on the super-lattice structure 53 and is provided for the second semiconductor layer 19. This growth is performed by, for example, a molecular beam epitaxy method.

Figure 4B:
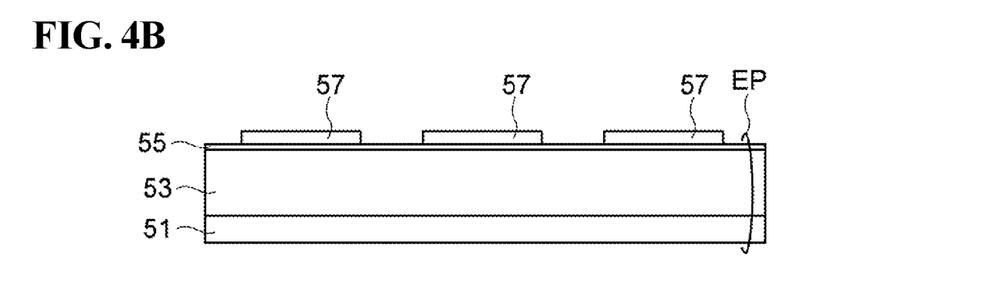

As illustrated in FIG. 4B, a mask 57 for defining the shapes of the second mesas 27 is formed on the first epitaxial region 50 of the epitaxial substrate EP by photolithography and etching. The mask 57 is made of, for example, silicon nitride.

Figure 5A:
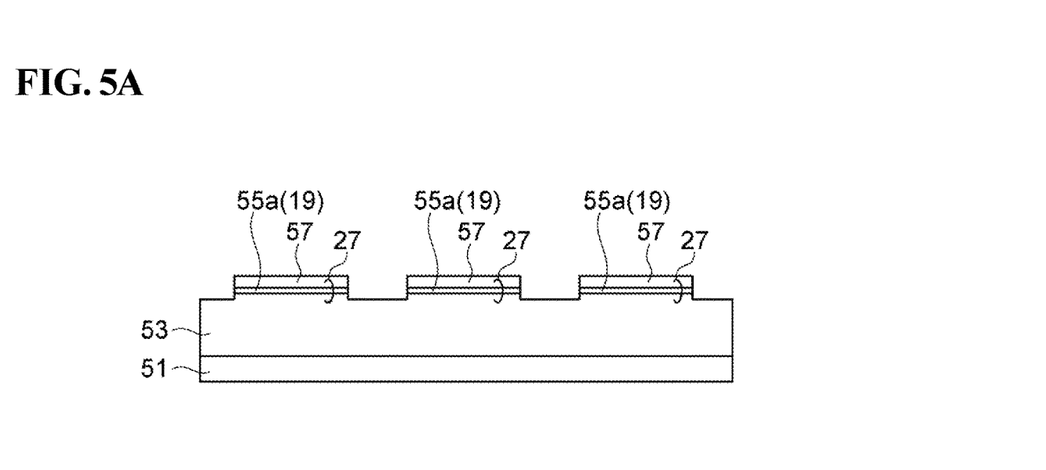
FIGS. 5A and 5B are schematic diagrams illustrating main steps in the method for producing the infrared-ray sensing device according to this embodiment.
Figure 5B:
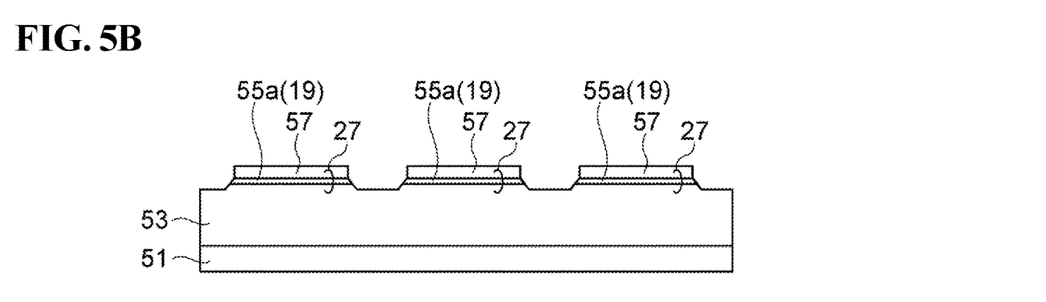

As illustrated in FIGS. 5A and 5B, the epitaxial substrate EP is etched by using the mask 57 to form second mesas. This etching is performed by using a wet etching method and/or a dry etching method. The etchant for dry etching contains HI/SiCl$_4$. The first epitaxial region 50 is etched to, for example, a depth of about 50 nm, so that the first semiconductor film 55 for the second semiconductor layer 19 is divided to form semiconductor films 55a. The upper part of the super-lattice structure 53 is also etched. Specifically, for example, when the first epitaxial region 50 is dry-etched, as illustrated in FIG. 5A, the pattern of the mask 57 is substantially transferred to form a plurality of mesas for the second mesas 27. These mesas have the side surface that extends substantially vertically and do not have a reverse mesa shape. The etchant for wet etching contains H$_3$PO$_4$H or Br. When the first epitaxial region 50 is wet-etched, as illustrated in FIG. 5B, mesas having a normal mesa shape are formed for the second mesas 27. These mesas have a side surface that tapers out from the pattern of the mask 57 and do not have a reverse mesa shape. Alternatively, etching for forming the second mesas may be performed by using the dry etching method and the wet etching method. In this Example, the dry etching method is used to process the epitaxial substrate EP.

Figure 6A:
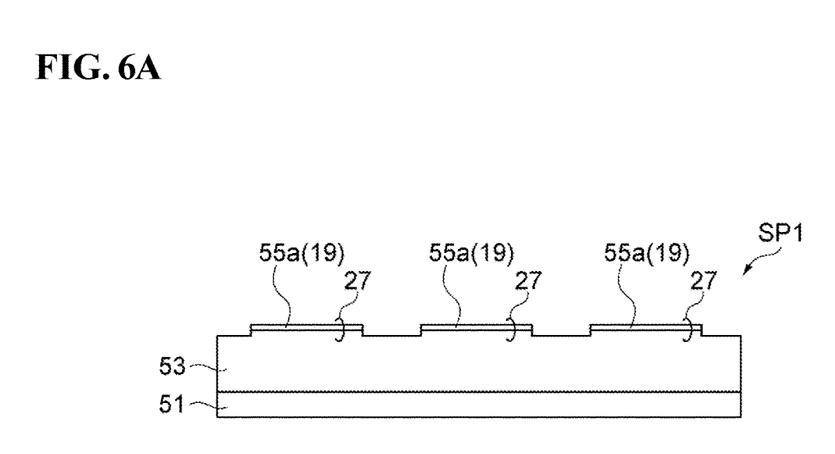
FIGS. 6A, 6B, and 6C are schematic diagrams illustrating main steps in the method for producing the infrared-ray sensing device according to this embodiment.

In the following description, the dry etching process illustrated in FIG. 5A is continued. As illustrated in FIG. 6A, the mask 57 is removed to form a first substrate product SP1. To remove SiN of the mask 57, hydrofluoric acid is used.

Figure 6B:
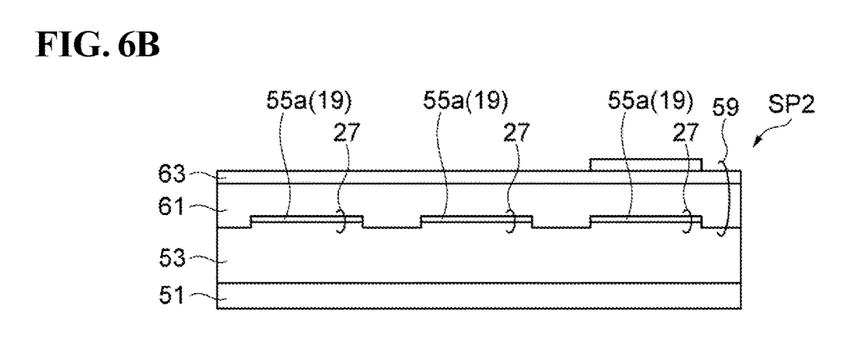

After removing the mask 57, as illustrated in FIG. 6B, a second epitaxial region 59 is grown on the entire surface of the first substrate product SP1 to form a second substrate product SP2. The second epitaxial region 59 includes a single semiconductor layer 61 and a semiconductor layer 63. The single semiconductor layer 61 is grown on the upper surface of the super-lattice structure 53 of the first substrate product SP1 and the side surface and the upper surface of the semiconductor film 55a (second semiconductor layer 19) and is provided for a third semiconductor layer 21. The semiconductor layer 63 is grown on the semiconductor layer 61 and is provided for a first semiconductor layer 17. The single semiconductor layer 61 is an n-type InGaAs film. The semiconductor layer 63 is a p-type InGaAs film. This growth is performed by, for example, a metal-organic vapor phase epitaxy method.

Figure 6C:
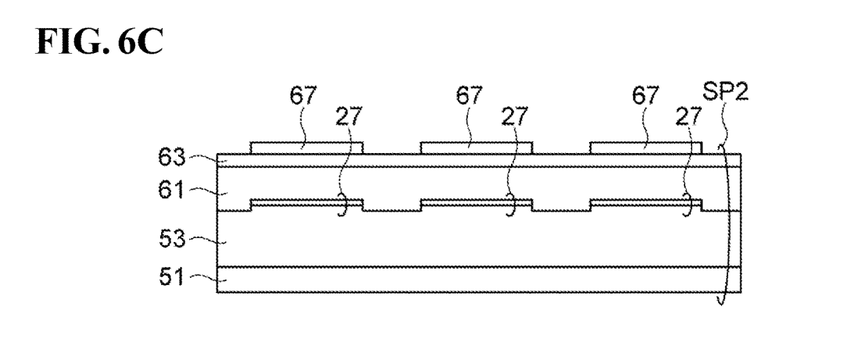

As illustrated in FIG. 6C, a mask 67 for defining first mesas 25 is formed on the second epitaxial region 59 of the second substrate product SP2 by photolithography and etching. The mask 67 is made of, for example, silicon nitride.

Figure 7A:
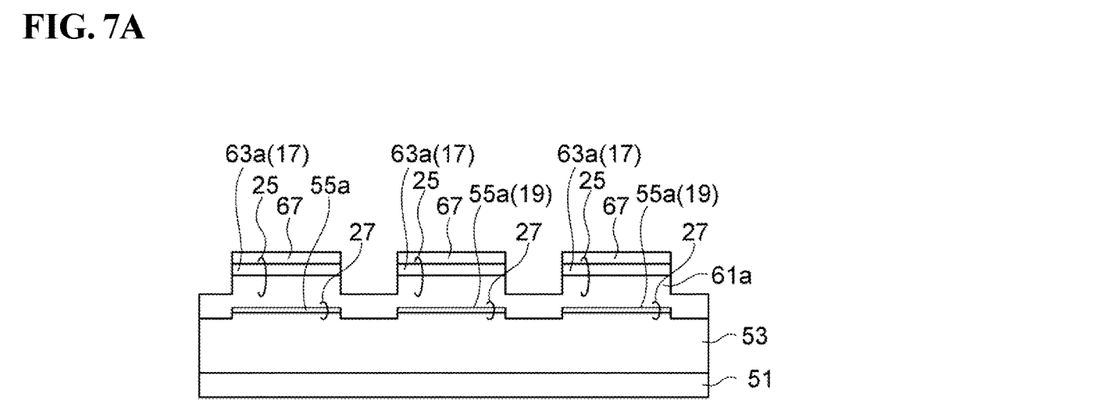
FIGS. 7A and 7B are schematic diagrams illustrating main steps in the method for producing the infrared-ray sensing device according to this embodiment.
Figure 7B:
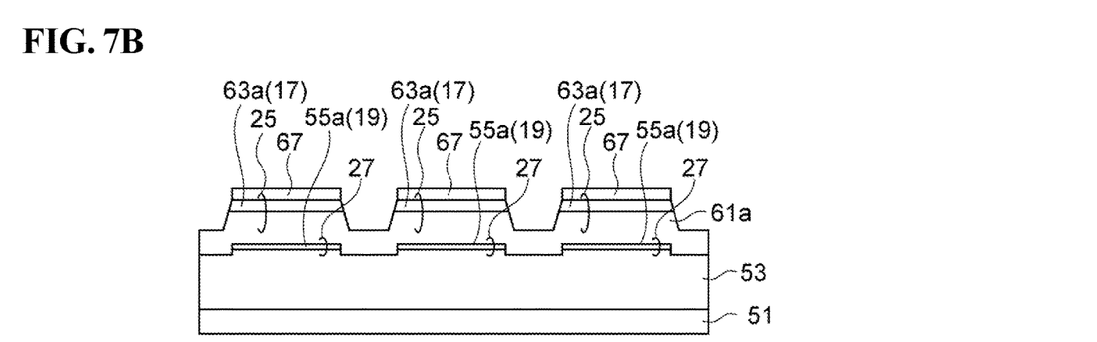

As illustrated in FIG. 7A, the second substrate product SP2 is etched by using the mask 67 to form the second mesas. This etching is performed by using the dry etching method, for example. The etchant for dry etching contains HI/SiCl$_4$. The second epitaxial region 59 is etched to, for example, a depth of about 500 nm, so that the semiconductor layer 63 for the first semiconductor layer 17 is divided to form semiconductor layers 63a. Moreover, the semiconductor layer 61 for the third semiconductor layer 21 is also etched to form a semiconductor layer 61a and thus to form the first mesas 25. Specifically, when the second epitaxial region 59 is dry-etched, as illustrated in FIG. 7A, the pattern of the mask 67 is substantially transferred to form a plurality of mesas for the first mesas 25. These mesas have a side surface that extends substantially vertically and do not have a reverse mesa shape. If desired, as illustrated in FIG. 7B, the etching may be performed by using the wet etching method instead of the dry etching method. The etchant for wet etching is, for example, an H$_3$PO$_4$-based or an HBr-based etchant. When the second epitaxial region 59 is wet-etched, mesas having a normal mesa shape are formed for the first mesas 25. In this case, each of the mesas having the normal mesa shape has a side surface that tapers out from the pattern of the mask 67. These mesas have the side surface that has a normal mesa shape and do not have a reverse mesa shape. Alternatively, etching for forming the second mesas may be performed by using the dry etching method and the wet etching method. In this Example, the dry etching method is used to process the second substrate product SP2. The mask 67 is not removed even after etching is completed.

Figure 8A:
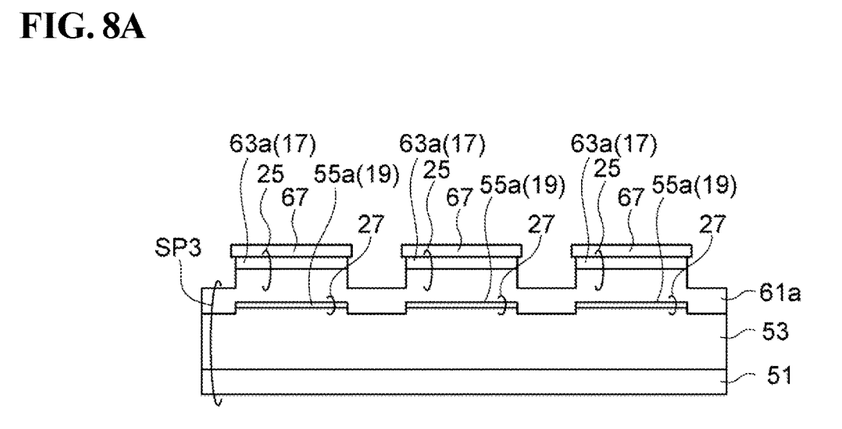
FIGS. 8A and 8B are schematic diagrams illustrating main steps in the method for producing the infrared-ray sensing device according to this embodiment.

In the following description, the dry etching process illustrated in FIG. 7A is continued. While the mask 67 is left, as illustrated in FIG. 8A, damage regions that may be produced by dry etching are removed by using the wet etching method. The etchant for this etching is, for example, an $H_3PO_4$-based or a Br-based etchant. After this etching, the mask 67 is removed to form a third substrate product SP3. For example, hydrofluoric acid is used to remove the mask 67.

Figure 8B:
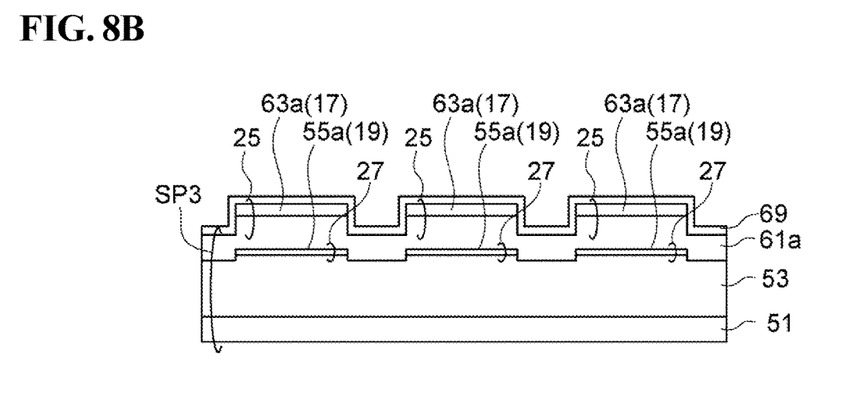

After removing the mask 67, as illustrated in FIG. 8B, an insulating film 69 for the protection of the surface of the photodiodes 15 is formed on the entire surface of the third substrate product SP3. The insulating film 69 is made of, for example, silicon oxide. The thickness of the silicon oxide film is, for example, 300 nm.

Figure 9A:
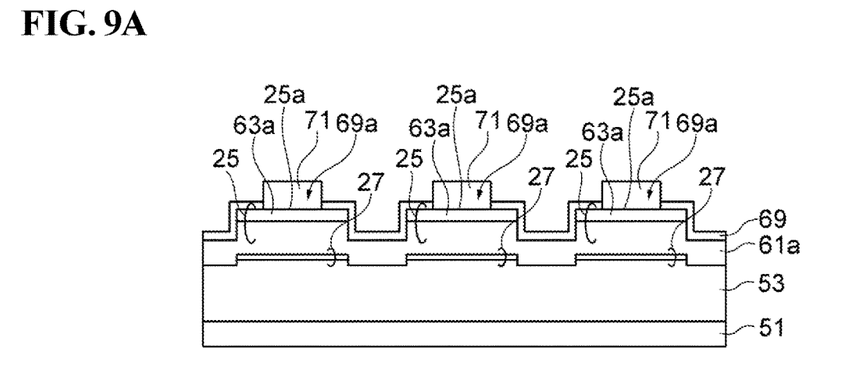
FIGS. 9A, 9B, and 9C are schematic diagrams illustrating main steps in the method for producing the infrared-ray sensing device according to this embodiment.

As illustrated in FIG. 9A, openings 69a are formed in the insulating film 69. Subsequently, electrodes 71 are formed in the openings 69a. The electrodes 71 are in contact with the upper surfaces 25a of the first mesas 25 through the openings 69a. The openings 69a of the insulating film 69 are formed by, for example, photolithography and etching. The electrodes 71 are formed by, for example, metal film deposition and a lift-off method. The electrode 71 contains, for example, Ti/Pt/Au.

Figure 9B:
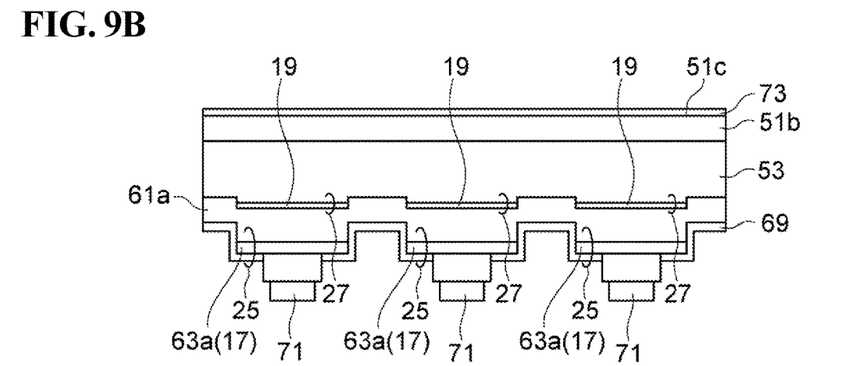

As illustrated in FIG. 9B, the back surface of the substrate 51 is polished to form a support 51b having a desired thickness. An anti-reflection coat film (AR coat film) 73 is formed on the back surface 51c of the support 51b. The AR coat film 73 is, for example, a SiON film. The thickness of the support 51b is, for example, 100 to 300 micrometers.

Figure 9C:
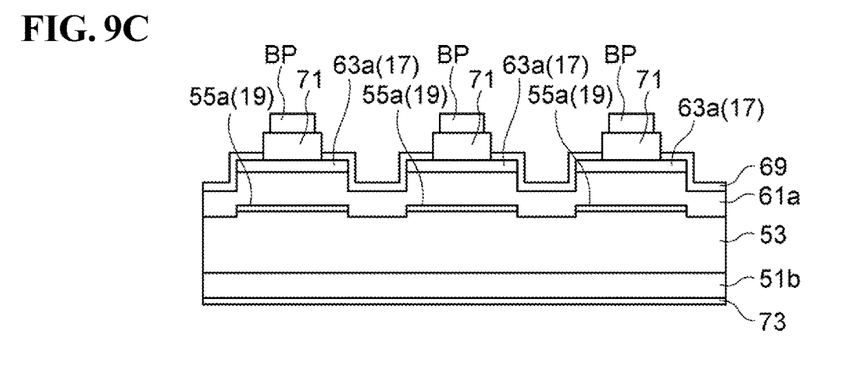

After forming the AR coat film 73, as illustrated in FIG. 9C, bump electrodes BP are formed on the electrodes 71. The bump electrodes BP are made of, for example, indium.

Although the principles of the present invention are described with reference to the drawings in preferred embodiments, it should be understood by those skilled in the art that arrangements and detailed changes can be made without departing from such principles of the present invention. The present invention is not limited to particular structures disclosed in the embodiments. Therefore, all modifications and changes made within the claims and the scope of the spirit are claimed.

What is claimed is:

1. An infrared-ray sensing device comprising:
    a support having a principal surface; and
    a plurality of photodiodes disposed on the principal surface of the support,
    wherein each photodiode of said plurality of photodiodes includes:
        a first mesa including a first semiconductor layer of a first conductivity type,
        a second semiconductor layer of the first conductivity type,
        a third semiconductor layer of a second conductivity type that is disposed between the first semiconductor layer and the second semiconductor layer, and
        a super-lattice region disposed on the principal surface of the support along a reference plane,
    wherein the third semiconductor layer and the super-lattice region are provided in common for said plurality of photodiodes, and
    wherein, in the photodiodes of said plurality,
        the first mesas and the second semiconductor layers are aligned along a first axis intersecting the reference plane so that each of the second semiconductor layers is provided in a position corresponding to the position of a first mesa, and
        the second semiconductor layer is disposed between the third semiconductor layer and the super-lattice region.

2. The infrared-ray sensing device according to claim 1, wherein, in the photodiodes of said plurality,
    the first semiconductor layer in the first mesa is in contact with the third semiconductor layer so as to form a first p-n junction at an interface between said first semiconductor layer and the third semiconductor layer, and
    the second semiconductor layer is in contact with the third semiconductor layer so as to form a second p-n junction at an interface between said second semiconductor layer and the third semiconductor layer.

3. The infrared-ray sensing device according to claim 1, wherein, in the photodiodes of said plurality,
    the first semiconductor layer in the first mesa reaches a side surface of said mesa,
    the side surface of said mesa is covered with an insulating film, and
    said mesa has a bottom in the third semiconductor layer.

4. The infrared-ray sensing device according to claim 1, wherein
    each photodiode of said plurality of photodiodes further includes a second mesa including the second semiconductor layer, and, in each said photodiode,
    the third semiconductor layer is disposed on a surface of the super-lattice region, a side surface of the second mesa thereof and an upper surface of the second mesa thereof so as to embed the second mesa thereof with the third semiconductor layer.

5. The infrared-ray sensing device according to claim 4, wherein
    each first mesa has a height larger than a thickness of each first semiconductor layer,
    each second mesa has a height equal to or larger than a thickness of each second semiconductor layer,
    each first semiconductor layer in each first mesa is in contact with the third semiconductor layer so as to form a first p-n junction at side and bottom surfaces of each said first semiconductor layer, and
    each second semiconductor layer in each second mesa is in contact with the third semiconductor layer so as to form a second p-n junction at side and upper surfaces of each said second semiconductor layer.

6. The infrared-ray sensing device according to claim 1, wherein
    each second semiconductor layer contains InGaAs with p-type conductivity, and
    the InGaAs has a p-type impurity concentration in a range of $5 \times 10^{15}$ $cm^{-3}$ or more and $5 \times 10^{16}$ $cm^{-3}$ or less.

7. The infrared-ray sensing device according to claim 1, wherein
    the super-lattice region includes a semiconductor containing antimony as a constituent element,
    each second semiconductor layer contains an InGaAs/GaAsSb super-lattice with p-type conductivity, and
    the InGaAs/GaAsSb super-lattice of each said second semiconductor layer has a p-type impurity concentration in a range of $5 \times 10^{15}$ $cm^{\times 3}$ or more and $5 \times 10^{16}$ $cm^{-3}$ or less.

8. The infrared-ray sensing device according to claim 1, wherein the third semiconductor layer contains n-type InGaAs,
    the first conductivity type of each second semiconductor layer is p-type conductivity, and
    the third semiconductor layer is in contact with each second semiconductor layer so as to form p-n junctions at an interface between the third semiconductor layer and each said second semiconductor layer.

9. The infrared-ray sensing device according to claim 1, wherein the super-lattice region includes a multi quantum well structure including an InGaAs/GaAsSb super-lattice.

* * * * *